(12) United States Patent
Iwanaga et al.

(10) Patent No.: US 9,355,442 B2
(45) Date of Patent: May 31, 2016

(54) FILM THICKNESS MEASUREMENT APPARATUS, FILM THICKNESS MEASUREMENT METHOD, AND NON-TRANSITORY COMPUTER STORAGE MEDIUM

(71) Applicant: Tokyo Electron Limited, Tokyo (JP)

(72) Inventors: Shuji Iwanaga, Koshi (JP); Tadashi Nishiyama, Koshi (JP); Kanzou Katou, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/689,091

(22) Filed: Apr. 17, 2015

(65) Prior Publication Data
US 2015/0324970 A1 Nov. 12, 2015

(30) Foreign Application Priority Data

May 8, 2014 (JP) .................................. 2014-097120

(51) Int. Cl.
| | |
|---|---|
| *G06K 9/00* | (2006.01) |
| *G06T 7/00* | (2006.01) |
| *H01L 21/67* | (2006.01) |
| *H01L 21/66* | (2006.01) |
| *G01B 11/06* | (2006.01) |
| *H04N 5/232* | (2006.01) |

(52) U.S. Cl.
CPC .............. *G06T 7/0004* (2013.01); *G01B 11/06* (2013.01); *H01L 21/67253* (2013.01); *H01L 22/12* (2013.01); *H04N 5/23229* (2013.01); *G06T 2207/10004* (2013.01); *G06T 2207/30148* (2013.01)

(58) Field of Classification Search
None
See application file for complete search history.

(56) References Cited

U.S. PATENT DOCUMENTS

| | | | | |
|---|---|---|---|---|
| 5,729,343 | A * | 3/1998 | Aiyer .................. | G01B 11/0675 356/504 |
| 6,519,045 | B2 * | 2/2003 | Kwon ..................... | H01L 22/12 257/E21.53 |
| 8,217,348 | B2 * | 7/2012 | Iwasaki ............... | G03F 7/70608 250/306 |
| 2008/0239267 | A1 * | 10/2008 | Suzuki .................... | G03F 1/144 355/53 |
| 2008/0316506 | A1 * | 12/2008 | Tsuru ................. | G01B 11/0641 356/632 |
| 2012/0293188 | A1 * | 11/2012 | Nikolenko ............... | G01B 7/06 324/655 |
| 2013/0114081 | A1 * | 5/2013 | Fukazawa .......... | G01N 21/9501 356/369 |

FOREIGN PATENT DOCUMENTS

| | | |
|---|---|---|
| JP | 2002-506198 A | 2/2002 |
| WO | 99/45340 A1 | 9/1999 |

* cited by examiner

*Primary Examiner* — Daniel Mariam
(74) *Attorney, Agent, or Firm* — Posz Law Group, PLC

(57) ABSTRACT

Film thickness measured values obtained by measurement in advance at a plurality of points on a measurement preparation substrate and coordinates corresponding to the film thickness measured values are acquired. A pixel value at each coordinates is extracted from a preparation imaged image obtained by imaging the measurement preparation substrate in advance by an imaging device. Correlation data between the pixel value extracted at each coordinates and the film thickness measured value at each coordinates is generated. A substrate being a film thickness measurement object is imaged by the imaging device to acquire an imaged image, and a film thickness of a film formed on the substrate being the film thickness measurement object is calculated on the basis of a pixel value of the imaged image and the correlation data.

11 Claims, 16 Drawing Sheets

| MEASUREMENT POINT NUMBER | X COORDINATE (mm) | Y COORDINATE (mm) | FILM THICKNESS MEASURED VALUE (nm) |
|---|---|---|---|
| 1 | −144 | 0 | 247 |
| 2 | −138 | 0 | 248.3 |
| 3 | −132 | 0 | 250 |
| ... | ... | ... | ... |
| 26 | 0 | 0 | 255.5 |
| ... | ... | ... | ... |
| 49 | 132 | 0 | 248.7 |
| 50 | 138 | 0 | 248.5 |
| 51 | 144 | 0 | 246.8 |

400

| MEASUREMENT POINT NUMBER | X COORDINATE (mm) | Y COORDINATE (mm) | PIXEL VALUE | | |
|---|---|---|---|---|---|
| | | | Red | Green | Blue |
| 1 | −144 | 0 | 125 | 68 | 204 |
| 2 | −138 | 0 | 124 | 68 | 205 |
| 3 | −132 | 0 | 125 | 68 | 204 |
| ... | ... | ... | ... | ... | ... |
| 26 | 0 | 0 | 126 | 69 | 206 |
| ... | ... | ... | ... | ... | ... |
| 49 | 132 | 0 | 122 | 71 | 208 |
| 50 | 138 | 0 | 122 | 71 | 208 |
| 51 | 144 | 0 | 122 | 70 | 207 |

FIG.13

| MEASUREMENT POINT NUMBER | X COORDINATE (mm) | Y COORDINATE (mm) | FILM THICKNESS MEASURED VALUE (nm) | PIXEL VALUE | | |
|---|---|---|---|---|---|---|
| | | | | Red | Green | Blue |
| 1 | −144 | 0 | 247 | 125 | 68 | 204 |
| 2 | −138 | 0 | 248.3 | 124 | 68 | 205 |
| 3 | −132 | 0 | 250 | 125 | 68 | 204 |
| ... | ... | ... | ... | ... | ... | ... |
| 26 | 0 | 0 | 255.5 | 126 | 69 | 206 |
| ... | ... | ... | ... | ... | ... | ... |
| 49 | 132 | 0 | 248.7 | 122 | 71 | 208 |
| 50 | 138 | 0 | 248.5 | 122 | 71 | 208 |
| 51 | 144 | 0 | 246.8 | 122 | 70 | 207 |

511

| PIXEL NUMBER | PIXEL VALUE |
|---|---|
| | Red |
| 1 | 131.79 |
| 2 | 132.38 |
| 3 | 132.12 |
| ... | ... |
| ... | ... |
| ... | ... |
| ... | ... |
| 623 | 126.51 |
| 624 | 129.38 |

512

513

| PIXEL NUMBER | PIXEL VALUE | FILM THICKNESS (nm) |
|---|---|---|
| | Red | |
| 1 | 131.79 | 250.5 |
| 2 | 132.38 | 250.7 |
| 3 | 132.12 | 250.6 |
| ... | ... | |
| ... | ... | |
| ... | ... | |
| ... | ... | |
| 623 | 126.51 | 249.2 |
| 624 | 129.38 | 249.9 |

| Average | 247.7 |
|---|---|
| 3 sigma | 11.48 |
| Max | 257.1 |
| Min | 239.8 |
| Range | 17.32 |

245.66　　　　　　　　　251.66

| Average | 249.8 |
|---|---|
| 3 sigma | 10.63 |
| Max | 259.2 |
| Min | 242.6 |
| Range | 16.56 |

246.81    252.81

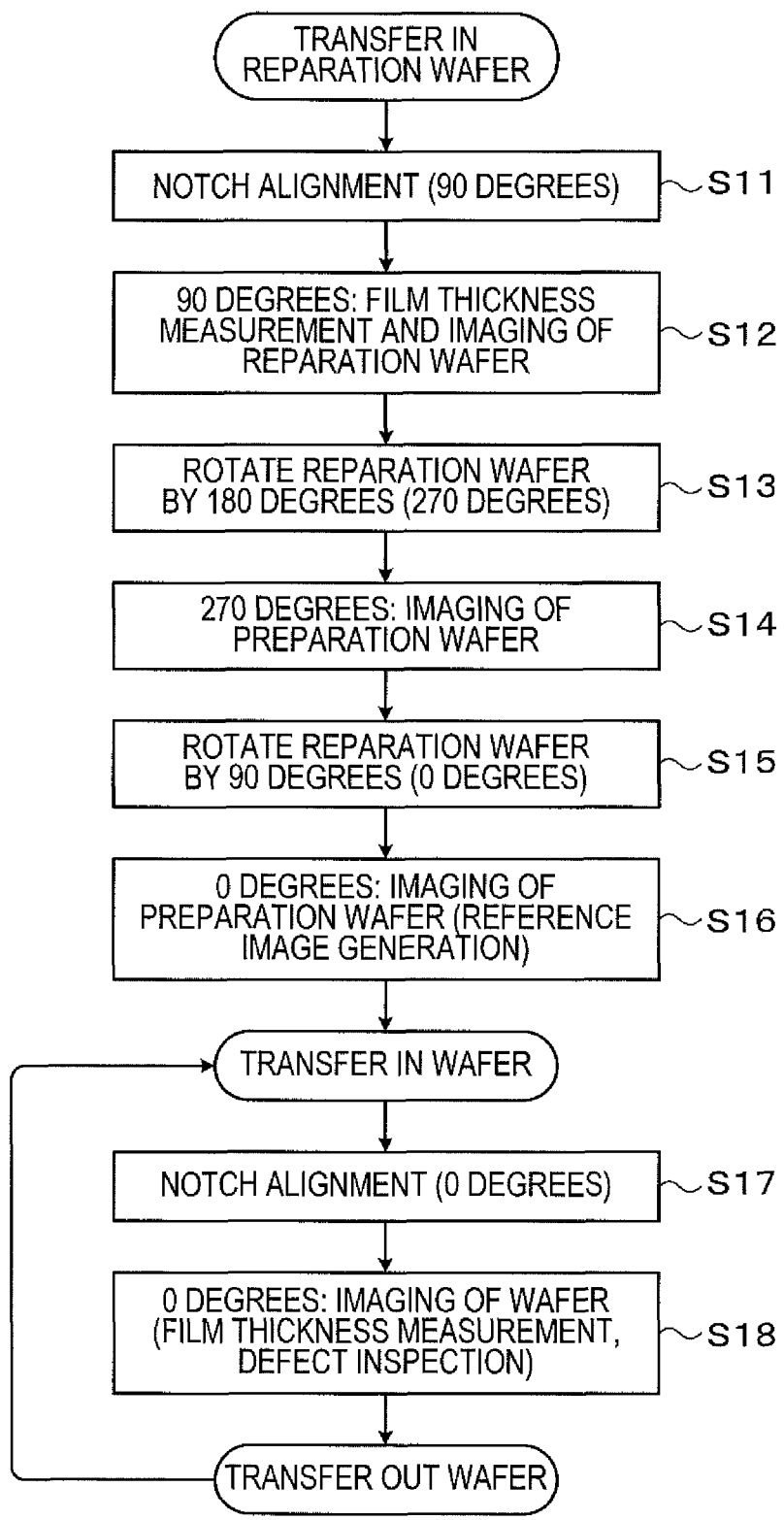

FILM THICKNESS MEASUREMENT APPARATUS, FILM THICKNESS MEASUREMENT METHOD, AND NON-TRANSITORY COMPUTER STORAGE MEDIUM

CROSS REFERENCE TO RELATED APPLICATIONS

This application is based upon and claims the benefit of priority of the prior Japanese Patent Application No. 2014-097120, filed in Japan on May 8, 2014, the entire contents of which are incorporated herein by reference.

BACKGROUND OF THE INVENTION

1. Field of the Invention

The present invention relates to an apparatus configured to measure the film thickness of a film formed on a substrate on the basis of a plurality of imaged substrate images, a method of measuring the film thickness, and a non-transitory computer storage medium.

2. Description of the Related Art

In a photolithography process in a manufacturing process of a semiconductor device, for example, a series of treatments such as a resist coating treatment of applying a resist solution onto a wafer to form a resist film, exposure processing of exposing the resist film to a predetermined pattern, a developing treatment of developing the exposed resist film and so on are performed in sequence to form a predetermined resist pattern on the wafer. The series of treatments are performed in a coating and developing treatment system being a substrate treatment system including various treatment units that treat the wafer, transfer mechanisms that transfer the wafer and so on.

The resist pattern formed by the above-described photolithography processing defines the processing shape of a base film in a subsequent process in manufacture of the semiconductor device, and it is very important to form the resist pattern with a desired lien width.

One of causes affecting the line width of the resist pattern is the film thickness of the resist film. Therefore, in the photolithography processing, for confirming whether or not the film thickness of the resist film is uniform within a plane of the wafer, film thickness measurement of the resist film on the wafer after application of the resist is performed by a film thickness inspection apparatus.

For the measurement of the film thickness, for example, a reflectance spectroscopic film thicknessmeter as disclosed in Japanese Translation of PCT International Application Publication No. 2002-506198 or the like is used. This film thicknessmeter radiates light to a film being a measurement object and measures the film thickness from the wavelength or the like of its reflected light.

Incidentally, the film thickness measurement using the above-described reflectance spectroscopy or the like counts predetermined positions on the wafer as points, point by point and therefore, when performing the film thickness measurement in detail for the wafer entire surface, requires time of 30 minutes or more, for example, for one 300 mm wafer. Therefore, generally, for example, about 50 measurement points are set as representative points on the wafer, and the film thickness measurement is performed for the representative points to thereby implement quality confirmation of the film thickness.

However, there is a risk that a film thickness abnormality occurring at a point other than the measurement points cannot be detected in the measurement of the representative points, so that the measurement time and the quality securement are in a trade-off relation. Further, with an increase in diameter of the wafer size to 450 mm in recent years, the rate of points not measured in the case where the measurement at 50 points as in the prior art is performed significantly increases as compared with the case of the 300 mm wafer, thereby making it more difficult to balance the quality securement and the measurement time.

SUMMARY OF THE INVENTION

The present invention has been made in consideration of the above points and its object is to perform film thickness measurement of a film formed on a substrate for the entire surface of the substrate in a short time.

To achieve the above object, the present invention is a film thickness measurement apparatus configured to measure a film thickness of a film formed on a substrate, the film thickness measurement apparatus including: an imaging device that images a front surface of the substrate; a measured value storage part that stores a plurality of film thickness measured values obtained by measurement in advance at a plurality of coordinates on a measurement preparation substrate and coordinates corresponding to the film thickness measured values, for a film formed on the measurement preparation substrate and having a non-uniform thickness; an image storage part that stores a preparation imaged image obtained by imaging the measurement preparation substrate in advance by the imaging device; a pixel value extraction part that extracts a pixel value at each coordinates stored in the measured value storage part from the preparation imaged image stored in the image storage part; a correlation data generation part that extracts, from the measured value storage part, the film thickness measured value at each coordinates corresponding to the extracted pixel value, and generates correlation data between the extracted film thickness measured value and the extracted pixel value; and a film thickness calculation part that calculates a film thickness of a film formed on a substrate being a film thickness measurement object on a basis of a pixel value of an imaged image of the substrate being the film thickness measurement object and the correlation data generated in the correlation data generation part.

According to the present invention, the correlation data between the pixel value and the film thickness measured value is generated in advance, so that the film thickness of the film formed on the substrate being the film thickness measurement object can be calculated based on the pixel value of the imaged image obtained by imaging the substrate being the film thickness measurement object and the correlation data. This makes it possible to obtain the film thickness from the image acquired using the imaging device such as a CCD camera. Accordingly, the film thickness about the entire surface of the substrate can be obtained in a short time without using the reflectance spectroscopic thicknessmeter as in the prior art.

The present invention according to another aspect is a film thickness measurement method of measuring a film thickness of a film formed on a substrate, the film thickness measurement method including: a film thickness coordinate acquisition step of acquiring film thickness measured values obtained by measurement in advance at a plurality of points on a measurement preparation substrate and coordinates corresponding to the film thickness measured values, for a film formed on the measurement preparation substrate and having a non-uniform thickness; a pixel value extraction step of extracting a pixel value at each coordinates acquired at the film thickness coordinate acquisition step from a preparation imaged image obtained by imaging the measurement preparation substrate in advance by an imaging device; a correlation data generation step of generating correlation data between the pixel value extracted at each coordinates and the film thickness measured value at each coordinates; and a film thickness calculation step of imaging a substrate being a film thickness measurement object by the imaging device to acquire an imaged image, and calculating a film thickness of a film formed on the substrate being the film thickness measurement object on a basis of a pixel value of the imaged image and the correlation data.

The present invention according to still another aspect is a non-transitory computer-readable storage medium storing a program running on a computer of a control device configured to control a film thickness measurement apparatus for the film thickness measurement apparatus to perform a film thickness measurement method of measuring a film thickness of a film formed on a substrate, the film thickness measurement method including: a film thickness coordinate acquisition step of acquiring film thickness measured values obtained by measurement in advance at a plurality of points on a measurement preparation substrate and coordinates corresponding to the film thickness measured values, for a film formed on the measurement preparation substrate and having a non-uniform thickness; a pixel value extraction step of extracting a pixel value at each coordinates acquired at the film thickness coordinate acquisition step from a preparation imaged image obtained by imaging the measurement preparation substrate in advance by an imaging device; a correlation data generation step of generating correlation data between the pixel value extracted at each coordinates and the film thickness measured value at each coordinates; and a film thickness calculation step of imaging a substrate being a film thickness measurement object by the imaging device to acquire an imaged image, and calculating a film thickness of a film formed on the substrate being the film thickness measurement object on a basis of a pixel value of the imaged image and the correlation data.

According to the present invention, it is possible to perform film thickness measurement of a film formed on a substrate for the entire surface of the substrate in a short time.

BRIEF DESCRIPTION OF THE DRAWINGS

FIG. 13 is an explanatory view exemplifying a correlation data table;

FIG. 25 is a flowchart illustrating main steps of film thickness measurement for a wafer according to another embodiment.

DETAILED DESCRIPTION OF THE INVENTION

Figure 1:
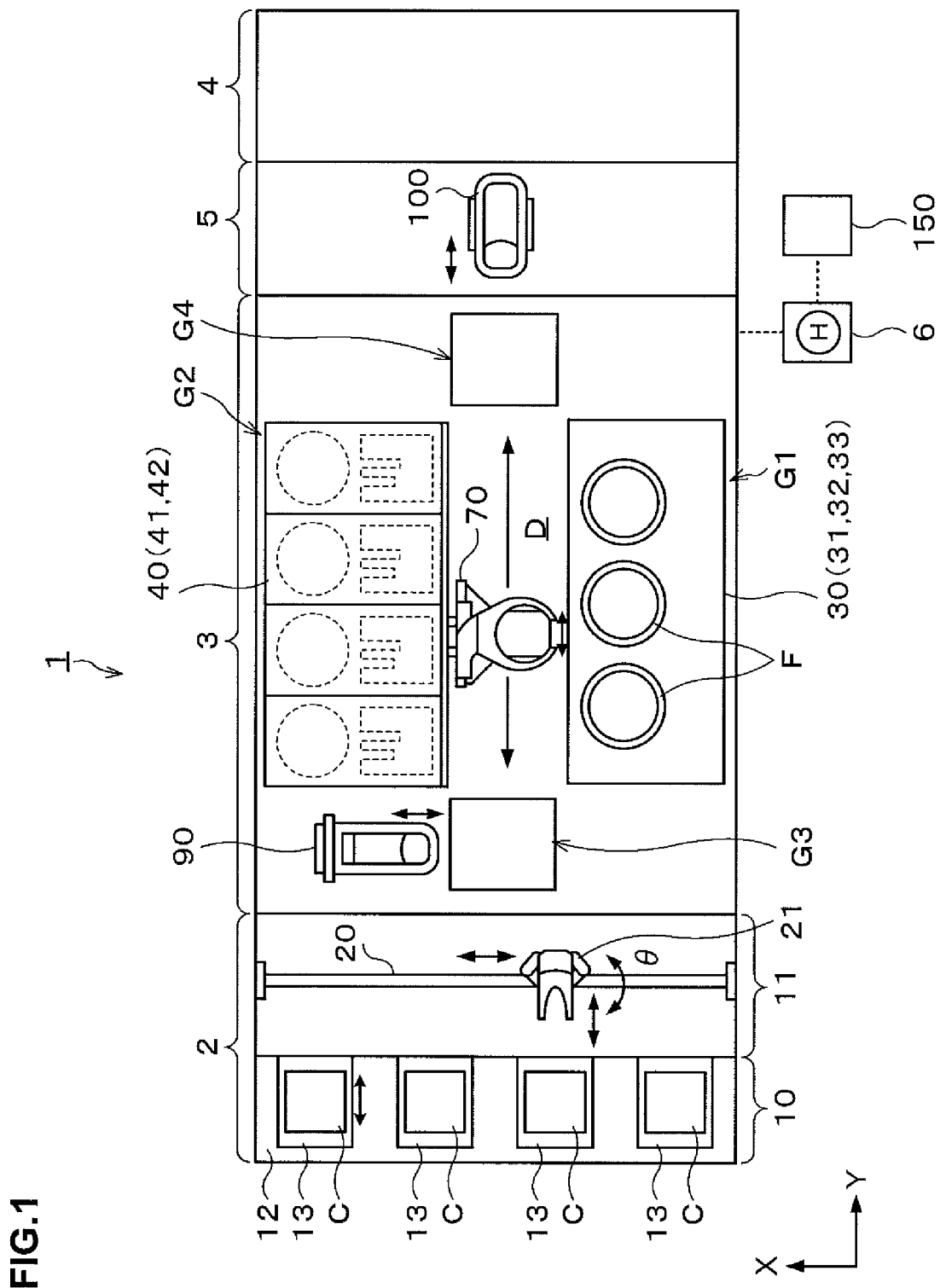
FIG. 1 is a plan view illustrating the outline of an internal configuration of a substrate treatment system according to an embodiment.
Figure 2:
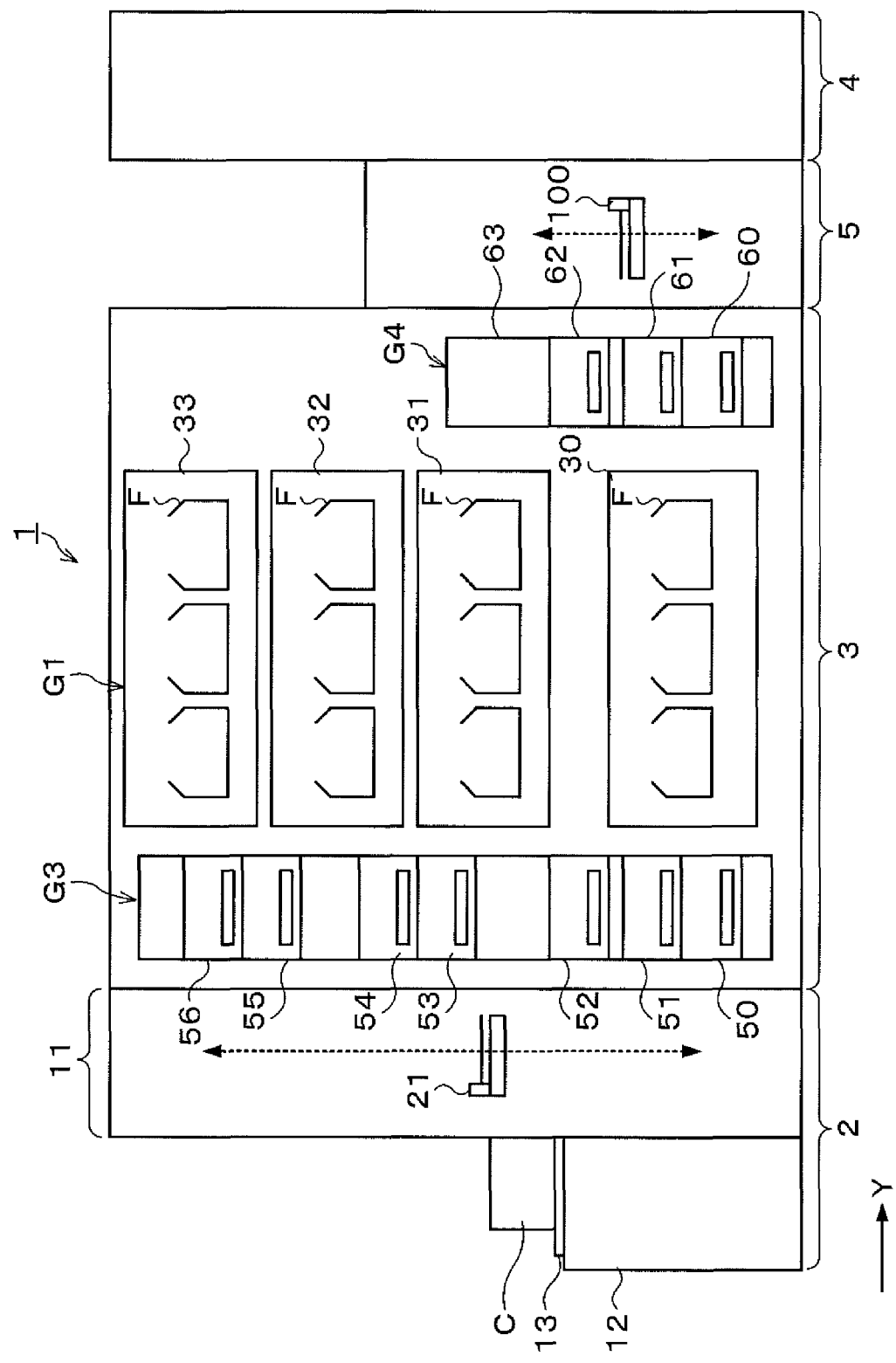
FIG. 2 is a side view illustrating the outline of the internal configuration of the substrate treatment system according to this embodiment.
Figure 3:
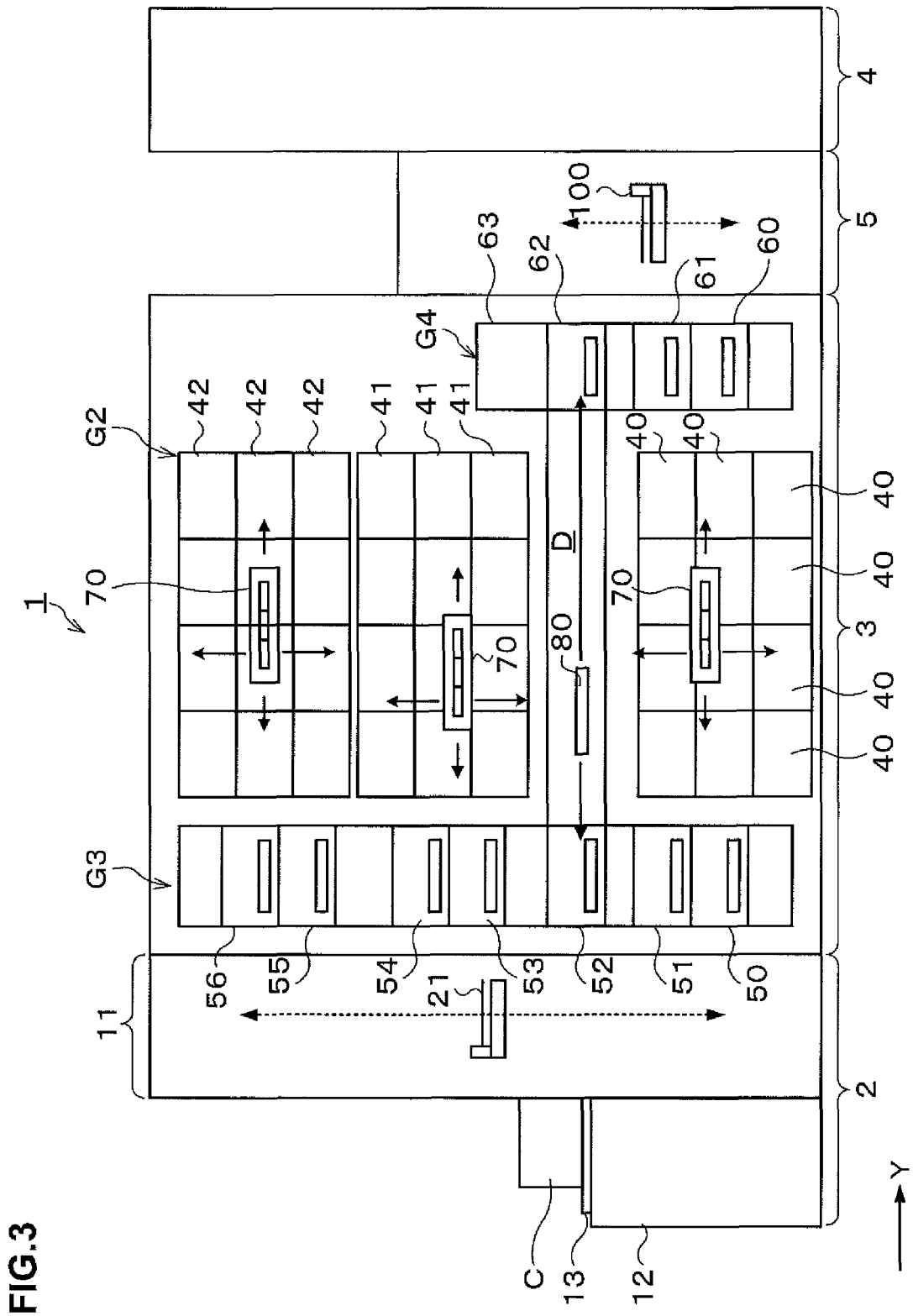
FIG. 3 is a side view illustrating the outline of the internal configuration of the substrate treatment system according to this embodiment.

Hereinafter, an embodiment of the present invention will be described. FIG. 1 is an explanatory view illustrating the outline of an internal configuration of a substrate treatment system 1 including a film thickness measurement apparatus according to this embodiment. FIG. 2 and FIG. 3 are side views illustrating the outline of the internal configuration of the substrate treatment system 1. Note that a case where the substrate treatment system 1 is a coating and developing treatment system which performs, for example, photolithography processing on a substrate and measures the film thickness of a resist film applied on a wafer W having a diameter of 300 mm by a film thickness measurement apparatus will be described as an example in this embodiment.

The substrate treatment system 1 has, as illustrated in FIG. 1, a configuration in which, for example, a cassette station 2 as a transfer-in/out section into which a cassette C is transferred in/out from/to, for example, the outside, a treatment station 3 which includes a plurality of various kinds of treatment units which perform predetermined treatments in a manner of single wafer treatment in the photolithography processing, and an interface station 5 which delivers the wafer W to/from an exposure apparatus 4 adjacent to the treatment station 3, are integrally connected. The substrate treatment system 1 also has a control device 6 which performs control of the substrate treatment system 1. To the control device 6, a later-described film thickness calculation mechanism 150 is connected.

The cassette station 2 is divided, for example, into a cassette transfer-in/out section 10 and a wafer transfer section 11. For example, the cassette transfer-in/out section 10 is provided at an end portion on a Y-direction negative direction (a left direction in FIG. 1) side in the substrate treatment system 1. In the cassette transfer-in/out section 10, a cassette mounting table 12 is provided. On the cassette mounting table 12, a plurality of, for example, four mounting plates 13 are provided. The mounting plates 13 are provided, arranged side by side in a line in an X-direction (an up-down direction in FIG. 1) being the horizontal direction. On the mounting plates 13, cassettes C can be mounted when the cassettes C are transferred in/out from/to the outside of the substrate treatment system 1.

In the wafer transfer section 11, a wafer transfer apparatus 21 is provided which is movable on a transfer path 20 extending in the X-direction as illustrated in FIG. 1. The wafer transfer apparatus 21 is movable also in the up-down direction and around a vertical axis (in a θ-direction), and can transfer the wafer W between the cassette C on each of the mounting plates 13 and a later-described delivery unit in a third block G3 in the treatment station 3.

In the treatment station 3, a plurality of, for example, four blocks G1, G2, G3, G4 are provided each including various units. For example, the first block G1 is provided on the front side (an X-direction negative direction side in FIG. 1) in the treatment station 3, and the second block G2 is provided on the rear side (an X-direction positive direction side in FIG. 1) in the treatment station 3. Further, the third block G3 is provided on the cassette station 2 side (the Y-direction negative direction side in FIG. 1) in the treatment station 3, and the fourth block G4 is provided on the interface station 5 side (a Y-direction positive direction side in FIG. 1) in the treatment station 3.

In the first block G1, as illustrated in FIG. 2, a plurality of solution treatment units, for example, a developing treatment unit 30 which performs a developing treatment on the wafer W, a lower anti-reflection film forming unit 31 which forms an anti-reflection film under a resist film of the wafer W (hereinafter, referred to as a "lower anti-reflection film"), a resist coating unit 32 which applies a resist solution to the wafer W to form a resist film, and an upper anti-reflection film forming unit 33 which forms an anti-reflection film over the resist film of the wafer W (hereinafter, referred to as an "upper anti-reflection film"), are four-tiered in order from the bottom.

Each of the units 30 to 33 in the first block G1 has a plurality of cups F, each of which houses the wafer W therein at treatment, in the horizontal direction, and can treat a plurality of wafers W in parallel.

In the second block G2, as illustrated in FIG. 3, thermal treatment units 40 each of which performs heat treatment and cooling treatment on the wafer W, adhesion units 41 as hydrophobic treatment apparatuses each of which performs hydrophobic treatment on the wafer W, and edge exposure units 42 each of which exposes the outer peripheral portion of the wafer W are arranged one on top of the other in the up-down direction and side by side in the horizontal direction. Note that the numbers and the arrangement of the thermal treatment units 40, adhesion units 41, and edge exposure units 42 can be arbitrarily selected.

In the third block G3, a plurality of delivery units 50, 51, 52, 53, 54, 55, 56 are provided in order from the bottom. Further, in the fourth block G4, a plurality of delivery units 60, 61, 62, and an imaging unit 63 which images the front surface of the wafer W are provided in order from the bottom.

A wafer transfer region D is formed in a region surrounded by the first block G1 to the fourth block G4 as illustrated in FIG. 1. In the wafer transfer region D, for example, a wafer transfer apparatus 70 is disposed.

The wafer transfer apparatus 70 has a transfer arm which is movable, for example, in the Y-direction, the front-back direction, the θ-direction, and the up-down direction. The wafer transfer apparatus 70 can move in the wafer transfer region D to transfer the wafer W to a predetermined unit in the first block G1, the second block G2, the third block G3 and the fourth block G4 therearound. A plurality of the wafer transfer apparatuses 70 are arranged, for example, one above the other as illustrated in FIG. 3 and can transfer the wafers W, for example, to predetermined units at about the same levels as them in the blocks G1 to G4.

Further, in the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction in FIG. 3. The shuttle transfer apparatus 80 can move in the Y-direction while supporting the wafer W and transfer the wafer W between the delivery unit 52 in the third block G3 and the delivery unit 62 in the fourth block G4.

As illustrated in FIG. 1, a wafer transfer apparatus 90 is provided on the X-direction positive direction side of the third block G3. The wafer transfer apparatus 90 has a transfer arm which is movable, for example, in the front-back direction, the θ-direction, and the up-down direction. The wafer transfer apparatus 90 can move up and down while supporting the wafer W to transfer the wafer W to each of the delivery units in the third block G3.

In the interface station 5, a wafer transfer apparatus 100 is provided. The wafer transfer apparatus 100 has a transfer arm which is movable, for example, in the front-back direction, the θ-direction, and the up-down direction. The wafer transfer apparatus 100 can transfer the wafer W to each of the delivery units in the fourth block G4 and the exposure apparatus 4 while supporting the wafer W by the transfer arm for instance.

Next, the configuration of the imaging unit 63 will be described.

Figure 4:
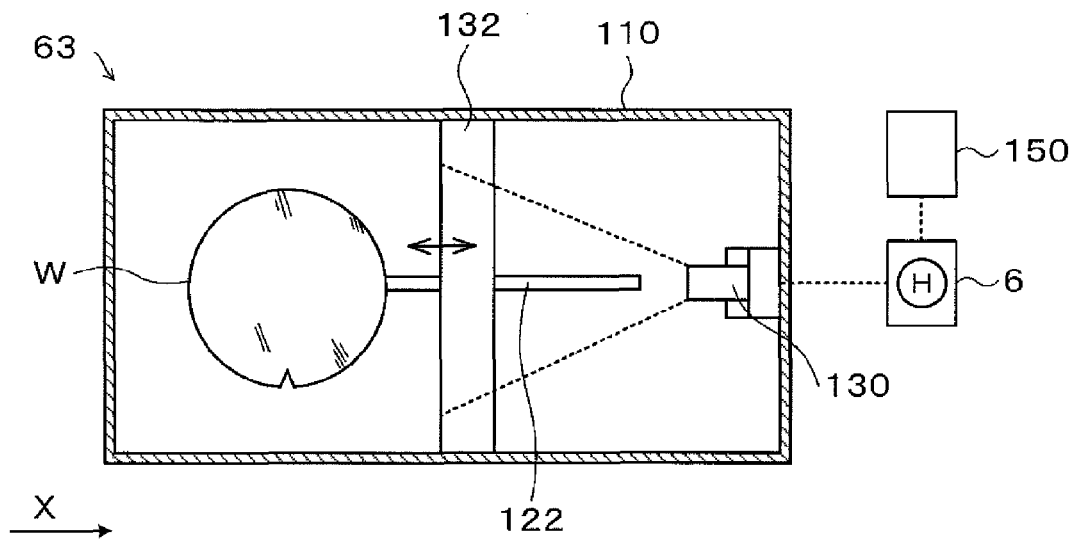
FIG. 4 is a transverse sectional view illustrating the outline of a configuration of an imaging unit.
Figure 5:
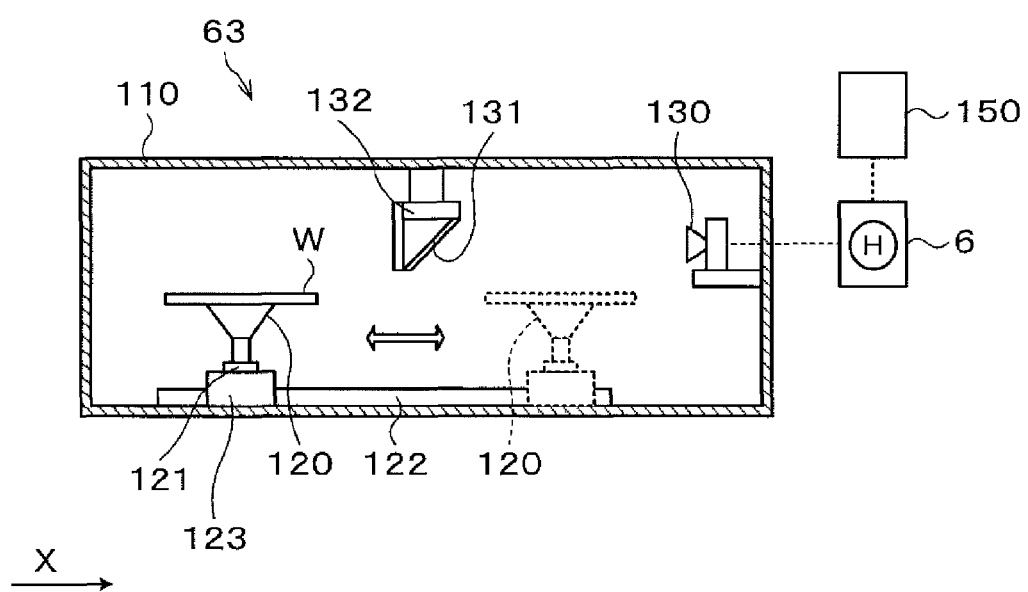
FIG. 5 is a longitudinal sectional view illustrating the outline of the configuration of the imaging unit.

The imaging unit 63 has a casing 110 as illustrated in FIG. 4. In the casing 110, a mounting table 120 on which the wafer W is mounted is provided as illustrated in FIG. 5. The mounting table 120 freely rotates and stops by means of a rotation drive part 121 such as a motor. On the bottom surface of the casing 110, a guide rail 122 is provided which extends from one end side (an X-direction negative direction side in FIG. 5) to the other end side (an X-direction positive direction side in FIG. 5) in the casing 110. The mounting table 120 and the rotation drive part 121 are provided on the guide rail 122 and movable along the guide rail 122 by means of a drive device 123.

An imaging device 130 is provided on a side surface on the other end side (the X-direction positive direction side in FIG. 5) inside the casing 110. For example, a wide-angle CCD camera is used as the imaging device 130. A case where the image imaged by the imaging device 130 has a number of bits of, for example, 8 (256 gradations from 0 to 255) and has three primary colors of RGB (Red, Green, Blue) will be described as an example.

Near the upper middle of the casing 110, a half mirror 131 is provided. The half mirror 131 is provided at a position facing the imaging device 130 and in a state that its mirror surface is inclined upward at 45 degrees toward the imaging device 130 from a state of being directed vertically downward. Above the half mirror 131, an illumination device 132 is provided. The half mirror 131 and the illumination device 132 are fixed to the upper surface of the inside of the casing 110. The illumination from the illumination device 132 passes through the half mirror 131 and is applied downward. Accordingly, light reflected off an object existing below the illumination device 132 is further reflected off the half mirror 131 and captured into the imaging device 130. In other words, the imaging device 130 can image the object existing within an irradiation region by the illumination device 132. Then, the imaged image of the wafer W is inputted into the control device 6 and into the film thickness calculation mechanism 150 via the control device 6.

The control device 6 is composed of a computer including, for example, a CPU, a memory and so on and has a program storage part (not illustrated). The program storage part stores a program that controls inspection of the wafer W performed based on the substrate image imaged in the imaging unit 63 and a program that controls devices in the imaging unit 63 when imaging the wafer W in the imaging unit 63. In addition to them, the program storage part also stores programs that control the operations of the above-described various treatment units and a drive system such as transfer apparatuses to realize predetermined actions in the substrate treatment system 1, namely, application of a resist solution to the wafer W, development, heat treatment, delivery of the wafer W, and control of the units. Note that the programs may be those recorded, for example, on a computer-readable storage medium H such as a hard disk (HD), compact disk (CD), magneto-optical disk (MO) or memory card and installed from the storage medium H into the control device 6.

Figure 6:
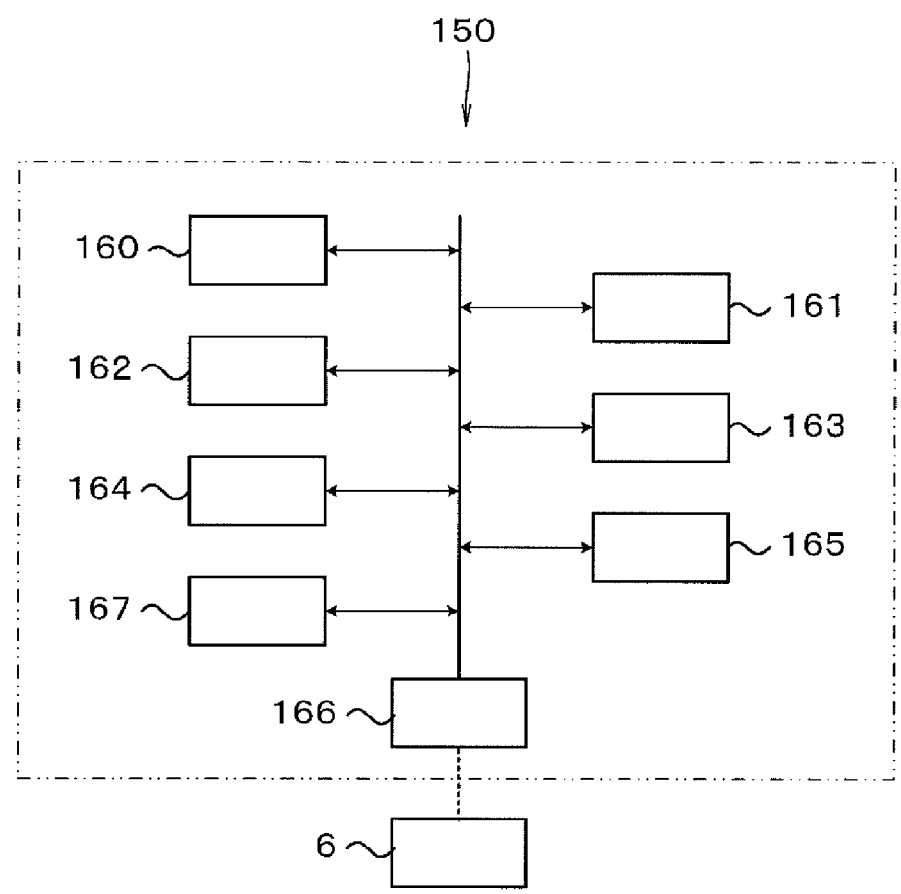
FIG. 6 is an explanatory view illustrating the outline of a configuration of a film thickness calculation mechanism.

Next, the configuration of the film thickness calculation mechanism 150 will be described. The film thickness calculation mechanism 150 is to calculate the film thickness of a film formed on a wafer front surface on the basis of the image of the wafer W imaged in the imaging unit 63 and is composed of a general-purpose computer including, for example, a CPU, a memory and so on. The outline of the configuration of the film thickness calculation mechanism 150 is illustrated in illustrated in FIG. 6. The film thickness calculation mechanism 150 includes: a measured value storage part 160 that stores data regarding film thickness measured values measured in advance in a film thickness measurement means provided outside the substrate treatment system 1; an image storage part 161 that stores the image imaged by the imaging device 130 of the imaging unit 63; an imaged image correction part 162 that calculates an imaging error in the imaging device 130 and corrects the image stored in the image storage part 161; a pixel value extraction part 163 that extracts a pixel value from the image stored in the image storage part 161; a correlation data generation part 164 that generates correlation data between the film thickness measured value and the extracted pixel value on the basis of the pixel value extracted in the pixel value extraction part 163 and the data regarding the film thickness measured value stored in the measured value storage part 160; and a film thickness calculation part 165 that calculates the film thickness of the film formed on the wafer W on the basis of the imaged image of the wafer W in the imaging unit 63 and the correlation data generated in the correlation data generation part 164.

Further, the film thickness calculation mechanism 150 further includes: a communication part 166 that inputs/outputs various kinds of information such as a substrate image from/to the control device 6; and an output/display part 167 that outputs and displays the image generated in the film thickness calculation mechanism 150 and so on. Note that the film thickness measurement apparatus according to the present invention is composed of the film thickness calculation mechanism 150 and the imaging unit 63.

Note that the image imaged by the imaging device 130 is composed of three primary colors of RGB as has already been described. Accordingly, this embodiment will be described assuming that the processing is performed for all of the primary colors R, G, B in parallel when not particularly specifying R, G, B.

Figure 7:
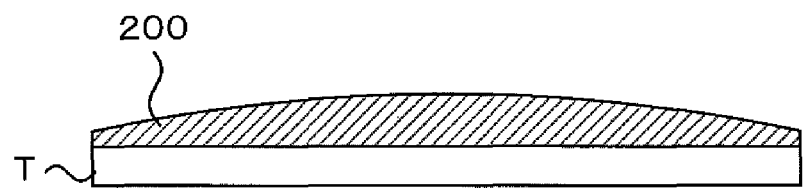
FIG. 7 is an explanatory view illustrating of a longitudinal section illustrating the shape of a film formed on an upper surface of a preparation wafer.

The measured value storage part 160 stores data regarding film thickness measured values measured in advance in the film thickness measurement means (not illustrated) provided outside the substrate treatment system 1. As the film thickness measurement means, for example, a thicknessmeter utilizing reflectance spectroscopy or the like can be used. In the film thickness measurement means outside the substrate treatment system 1, the film thickness of a predetermined film 200 formed, as illustrated in FIG. 7, on the upper surface of a measurement preparation wafer T (hereinafter, simply referred to as a "preparation wafer T") as a measurement preparation substrate is measured in advance. The film 200 has, as illustrated in FIG. 7, a non-uniform thickness within the preparation wafer T, and its film thickness is set so that, for example, a target value of the film thickness of a resist film to be formed on the wafer W in the substrate treatment system 1 exists between the minimum value and the maximum value of the film thickness. Note that the maximum value and the minimum value of the film thickness are preferably set, for example, to about ±3 nm to 5 nm from the target value of the film thickness. Further, a shape in which the film 200 on the preparation wafer T becomes thicker toward its center is drawn in FIG. 7, but the shape of the film 200 is not limited to the content of this embodiment.

Figure 8:
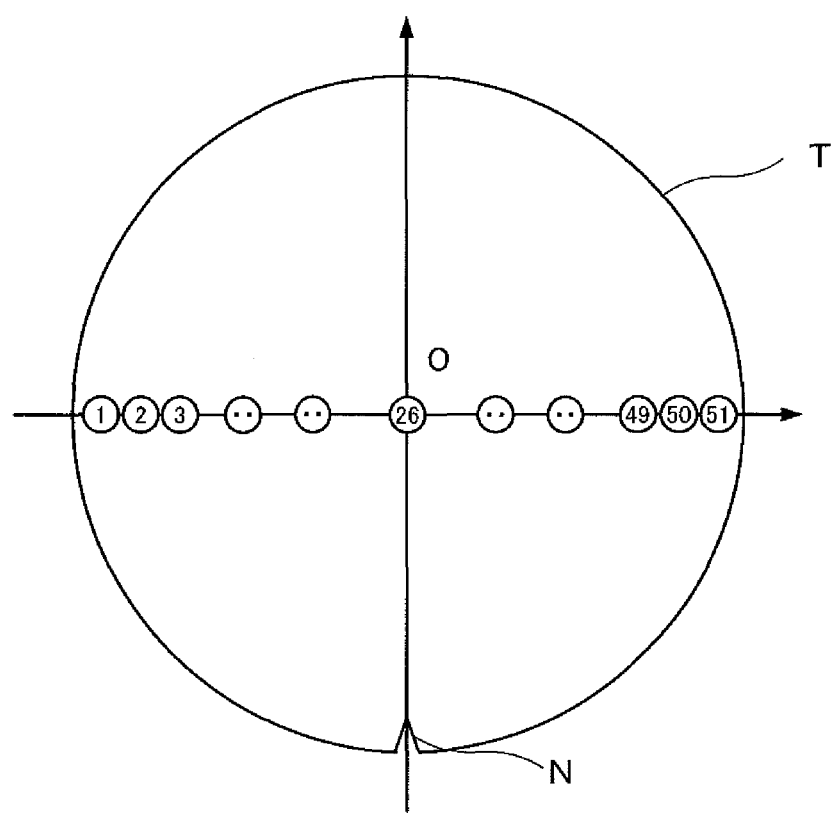
FIG. 8 is an explanatory view of a plane illustrating measurement points of the film thickness on the preparation wafer.

The measurement of the film thickness by the film thickness measurement means is performed such that the film thickness is measured in advance along a direction of the diameter of the preparation wafer T, for example, in a state that an angle of a notch N of the preparation wafer T is set to 0 degrees (a state that the notch N is located in the lower direction in FIG. 8) as illustrated in FIG. 8. In this embodiment, the measurement is performed at 51 points, for example, at a pitch of 6 mm along an X-axis of XY coordinates, for example, with the center of the preparation wafer T as an origin O. Circled numbers along the X-axis illustrated in FIG. 8 are management numbers of measurement points. Note that the places and numbers of the measurement points are not limited to the content of this embodiment, but the places and numbers of the measurement points can be arbitrarily set and the measurement points may be concentrically set for instance, as long as the measurement is performed such that the target value of the film thickness of the resist film is included in the film thickness measured value, for example, at an arbitrary measurement point. Note that the target value of the film thickness in this embodiment is, for example, 250 nm.

Figures 9, 10:
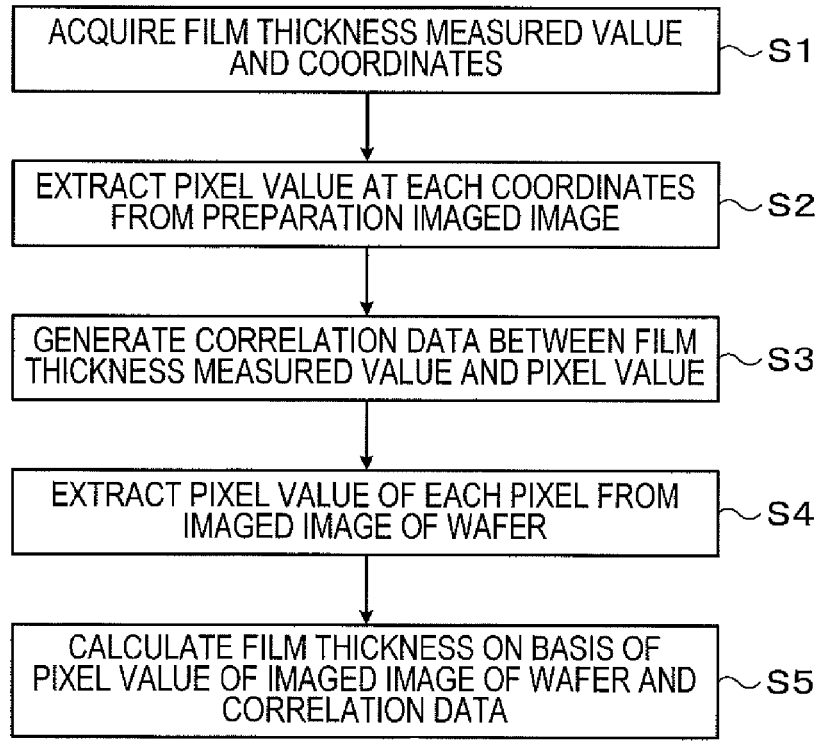
FIG. 9 is an explanatory view exemplifying a measured value table to be stored in a measured value storage part.
FIG. 10 is a flowchart illustrating main steps of film thickness measurement of a wafer.

The film thickness of the film 200 on the preparation wafer T measured by the film thickness measurement means is acquired as a measured value table 400 together with coordinates corresponding to the film thickness measured value, for example, for each measurement point as illustrated in FIG. 9 (a film thickness coordinate acquisition step: Step S1 in FIG. 10), and the acquired measured value table 400 is stored in the measured value storage part 160.

Figures 11, 12:
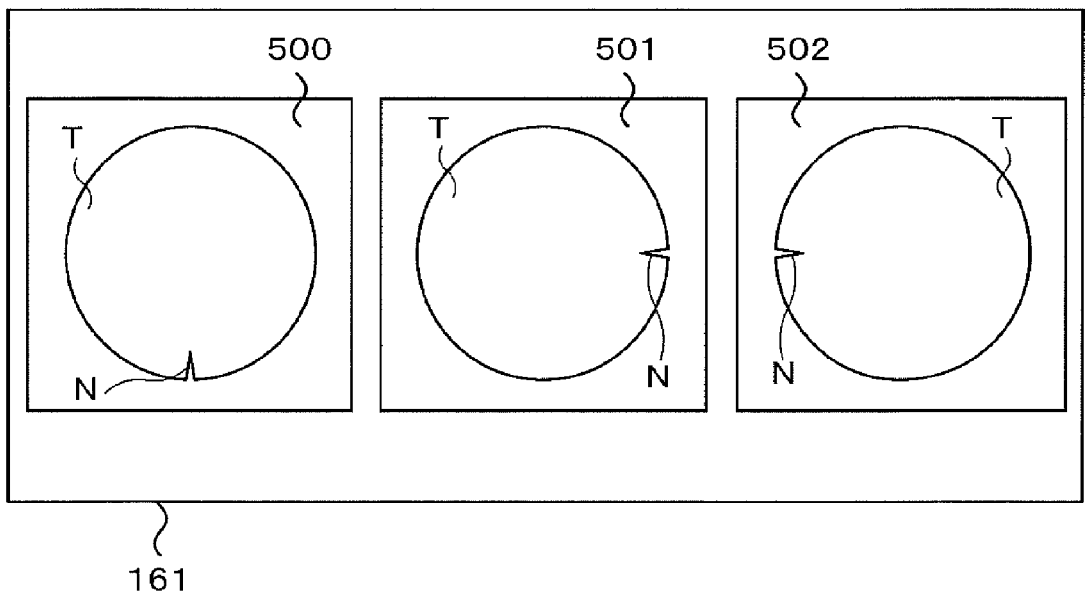
FIG. 11 is an explanatory view illustrating a preparation imaged image stored in an image storage part.
FIG. 12 is an explanatory view exemplifying a pixel value extraction table.

The image storage part 161 stores the imaged image (preparation imaged image) acquired by imaging the preparation wafer T in advance in the imaging unit 63. In this embodiment, the image storage part 161 stores, for example, a total of three images which are a preparation imaged image 500 imaged with the angle of the notch N set to 0 degrees, another preparation imaged image 501 imaged with the angle of the notch N set to 90 degrees, and another preparation imaged image 502 imaged with the angle of the notch N set to 270 degrees (−90 degrees) as illustrated in FIG. 11.

The pixel value extraction part 163 extracts a pixel value at each coordinates stored in the measured value storage part 160, for example, from the preparation imaged image 500 stored in the image storage part 161. More specifically, the pixel value extraction part 163 extracts pixel values of R, G, B, for example, at the pixel corresponding to each coordinates illustrated in FIG. 9, and generates a pixel value extraction table 510 as illustrated in FIG. 12 (a pixel value extraction step: Step S2 in FIG. 10).

The correlation data generation part 164 extracts, from the measured value table 400, the film thickness measured value at each coordinates corresponding to the pixel value extracted by the pixel value extraction part 163, namely, the film thickness measured value at each coordinates in the pixel value extraction table 510, and generates a correlation data table 511 as illustrated in FIG. 13 in which the extracted film thickness measured value and the pixel value extracted by the pixel value extraction part 163 are associated with each other. In other words, in the correlation data table 511, the pixel value and the film thickness measured value at the same coordinates are associated with each other. More specifically, for example, at X, Y coordinates (−144, 0) of a measurement number of "1" illustrated in FIG. 12, the film thickness measured value is "247" nm, and the pixel values of the pixel corresponding to the same coordinates ((X, Y)=(−144, 0)) in the preparation imaged image 500 are associated with "125", "68", "204" for R, G, B respectively.

Figures 14, 15:
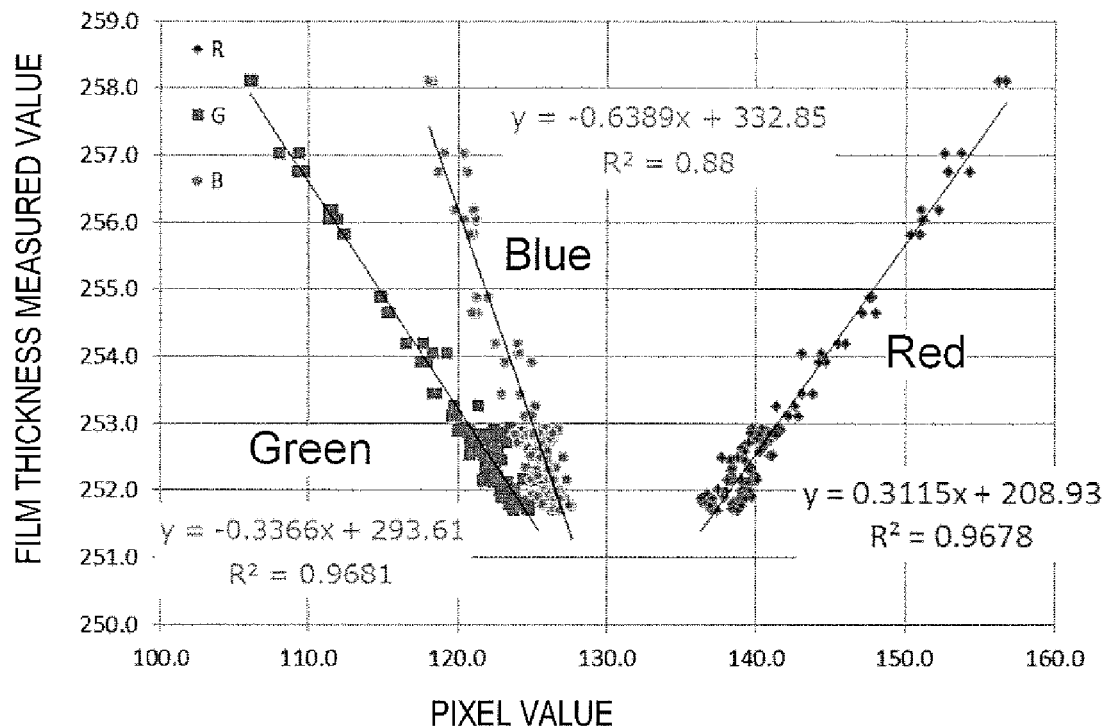
FIG. 14 is graphs each illustrating the correlation between a pixel value and a film thickness measured value.
FIG. 15 is an explanatory view exemplifying a pixel value data table.

Further, the correlation data generation part 164 plots the film thickness measured value in the correlation data table 511 and the pixel value, for example, as a graph as illustrated in FIG. 14, to generate a graph (correlation function) expressing the correlation between the film thickness measured value and the pixel value (a correlation data generate step: Step S3 in FIG. 10). In FIG. 14, for example, the horizontal axis represents the pixel value and the vertical axis represents the film thickness measured value, and the graph is created for the relation between the pixel value and the film thickness for each of the three colors of R, G, B. This graph represents, for example, when a film with a predetermined film thickness is imaged, what the pixel value of the imaged image is. Therefore, for example, if the pixel value of the imaged image of the wafer W acquired in the imaging unit 63 is known, it becomes possible to find the film thickness corresponding to the pixel value from the graph. Then, the correlation data generation part 164, after generating the graphs illustrated in FIG. 14, selects from the graphs a color that has, for example, the largest change amount in pixel value to the change in film thickness measured value from among the three colors of R, G, B. This is because there are a color having good sensitivity and a color having bad sensitivity to the change in film thickness depending on the kind of a film to be formed on the wafer W, and it is preferable to select optimum correlation data (a color having good sensitivity) in order to calculate an accurate film thickness in the later-described film thickness calculation part 165. In this embodiment, for example, the graph of red (R) has a large change amount in pixel value to the change in film thickness measured value, and therefore "red" is selected. Note that even if the change amount in pixel value to the change in film thickness measured value is large, when the graph has a large change amount and a correlation coefficient $R^2$ is small, it is impossible to calculate an accurate film thickness in the calculation of the film thickness in the film thickness calculation part 165, so that it is more preferable to select a color having the largest correlation coefficient $R^2$. Note that the information in the correlation data table 511 is approximated by a linear expression in FIG. 14, but may be approximated by a function of a quadratic expression or higher depending on the variation of data.

The film thickness calculation part 165 calculates the film thickness of the resist film on the wafer W on the basis of the imaged image of, for example, the wafer W after application of the resist film in the resist coating unit 32, imaged in the imaging unit 63 and the graph in FIG. 14. Concretely, the film thickness calculation part 165 first extracts the pixel value of each pixel of the imaged image imaged in the imaging unit 63, and generates a pixel value data table 512 as illustrated in FIG. 15 (Step S4 in FIG. 10). In this event, the pixel value data table 512 is generated for a color having a large change amount to the change in film thickness measured value or a color having the largest correlation coefficient $R^2$. Note that the pixel value data table 512 in FIG. 15 illustrates the example of the case where the pixel values, for example, of pixels at 624 points are extracted, but the number of pixels whose pixel values are extracted can be arbitrarily set. With a larger number of pixels, a more accurate film thickness distribution within the wafer W can be obtained, so that a larger number of pixels is more preferable.

Figures 16, 17:
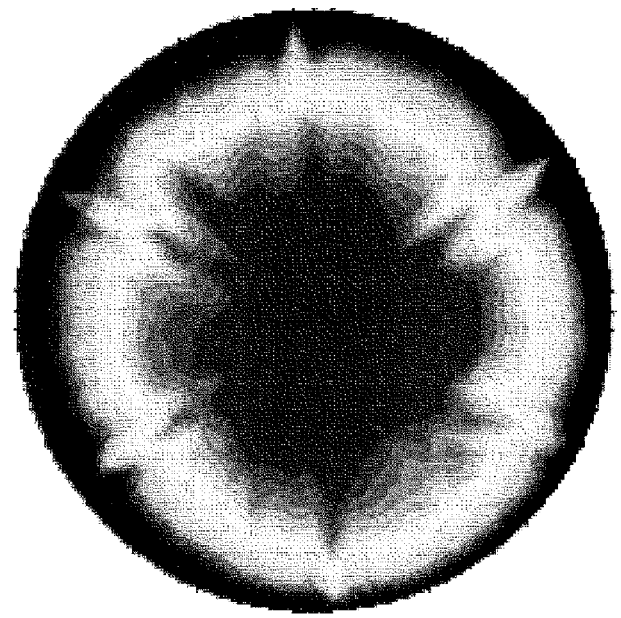
FIG. 16 is an explanatory view exemplifying a film thickness calculation table.
FIG. 17 is a film thickness distribution chart generated by plotting a film thickness calculated from the film thickness calculation table.

Then, a film thickness corresponding to the pixel value of each pixel is obtained from the pixel value data table 512 and the graph in FIG. 14, as a film thickness calculation table 513 illustrated in FIG. 16. Concretely, for example, a pixel value "131.79" corresponding to a pixel having a pixel number "1" illustrated in FIG. 15 is substituted into "X" of "Y=0.3115X+ 208.93" being a graph about the red color to thereby calculate a film thickness Y. Then, calculation of the film thickness Y is performed for all of the pixels to a pixel having a pixel number "624" to thereby generate the film thickness calculation table 513 as illustrated in FIG. 16.

Figure 18:
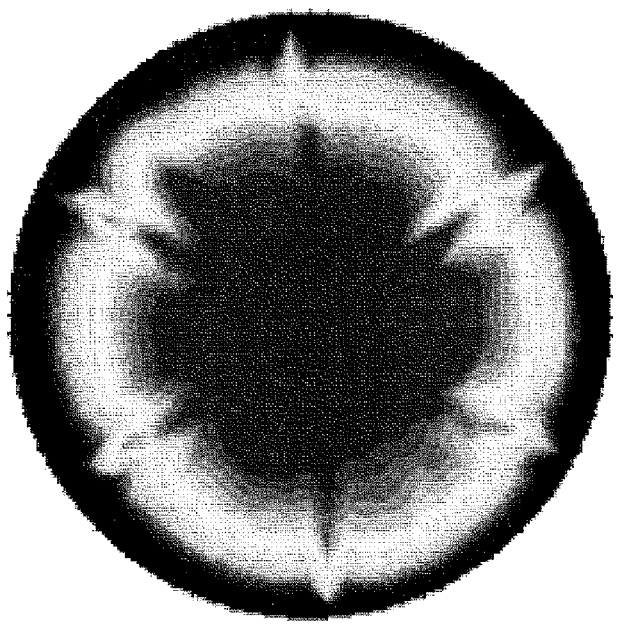
FIG. 18 is a film thickness distribution chart generated by plotting on a wafer a film thickness actually measured by a film thickness measurement means.

In this event, coordinates on the imaged image of each of the pixels having numbers "1" to "624" are already known, so that, for example, a film thickness distribution chart as illustrated in FIG. 17 in which the film thickness of each pixel found by the film thickness calculation table 513 is plotted on the wafer W can be generated (a film thickness calculation step: Step S5 in FIG. 10). This makes it possible to calculate the film thickness over the entire surface of the wafer W from the imaged image by the imaging unit 63. The image in FIG. 17 is displayed, for example, on the output/display part 167. Note that as data for comparison, a film thickness distribution chart generated by plotting on the wafer the film thickness actually measured by the film thickness measurement means is illustrated in FIG. 18. Though there is a slight difference in the minimum value and the maximum value of the film thickness and the average value of the film thickness between FIG. 17 and FIG. 18, the distribution tendencies of the film thickness within the wafer W are substantially coincide with each other, which shows that an excellent film thickness distribution chart can be obtained.

Note that the function of the imaged image correction part 162 that corrects the image stored in the image storage part 161 will be described later.

The substrate treatment system 1 according to this embodiment is configured as described above, and treatments on the wafer W performed in the substrate treatment system 1 configured as above and a film thickness measurement method using the film thickness calculation mechanism 150 and the imaging unit 63 will be described next.

In the treatments on the wafer W, a cassette C housing a plurality of wafers W is mounted on a predetermined mounting plate 13 in the cassette transfer-in/out section 10. Then, the wafers W in the cassette C are sequentially taken out by the wafer transfer apparatus 21, and transferred to, for example, the delivery unit 53 in the third block G3 of the treatment station 3.

Then, the wafer W is transferred by the wafer transfer apparatus 70 to the thermal treatment unit 40 in the second block G2 and temperature-regulated. Thereafter, the wafer W is transferred by the wafer transfer apparatus 70, for example, to the lower anti-reflection film forming unit 31 in the first block G1, in which a lower anti-reflection film is formed on the wafer W. The wafer W is then transferred to the thermal treatment unit 40 in the second block G2 and subjected to heat treatment. The wafer W is then returned back to the delivery unit 53 in the third block G3.

Then, the wafer W is transferred by the wafer transfer apparatus 90 to the delivery unit 54 in the same third block G3. Thereafter, the wafer W is transferred by the wafer transfer apparatus 70 to the adhesion unit 41 in the second block G2 and subjected to a hydrophobic treatment. The wafer W is then transferred by the wafer transfer apparatus 70 to the resist coating unit 32, in which a resist film is formed on the wafer W. The wafer W is then transferred by the wafer transfer apparatus 70 to the thermal treatment unit 40 and subjected to a pre-baking treatment. The wafer W is then transferred by the wafer transfer apparatus 70 to the delivery unit 62 in the fourth block G4. The wafer W is then transferred by the wafer transfer apparatus 100 to the imaging unit 63 in which the front surface of the wafer W is imaged. Data on the imaged image imaged by the imaging device 130 in the imaging unit 63 is inputted into the film thickness calculation mechanism 150 via the control device 6.

Then, the film thickness calculation part 165 in the film thickness calculation mechanism 150 extracts the pixel value from each of the pixels of the imaged image of the wafer W imaged by the imaging device 130 and generates the pixel value data table 512 (Step S4 in FIG. 10). Then, the film thickness calculation part 165 calculates the film thickness in a unit of each pixel on the basis of the previously generated correlation data (a function of the graph illustrated in FIG. 14) between the film thickness and the pixel value through Steps S1 to S3, and generates the film thickness distribution chart as illustrated in FIG. 17 (Step S5 in FIG. 10).

As a result of the calculation of the film thickness by the film thickness calculation mechanism 150, for example, when the film thickness distribution is in a desired state, the wafer W is transferred by the wafer transfer apparatus 70 to the upper anti-reflection film forming unit 33 in which an upper anti-reflection film is formed on the wafer W. When the film thickness distribution is not in the desired state, or when it is confirmed from the image generated at Step S5 that defects such as splatter and wedging have occurred, the treatment on the wafer W is stopped and the wafer W is recovered into the cassette C.

The wafer W on which the anti-reflection film has been formed is transferred by the wafer transfer apparatus 70 to the thermal treatment unit 40 and heated and thereby temperature-regulated. Thereafter, the wafer W is transferred to the edge exposure unit 42 and subjected to edge exposure processing.

The wafer W is then transferred by the wafer transfer apparatus 70 to the delivery unit 56 in the third block G3.

The wafer W is then transferred by the wafer transfer apparatus 90 to the delivery unit 52 and transferred by the shuttle transfer apparatus 80 to the delivery unit 62 in the fourth block G4. The wafer W is then transferred by the wafer transfer apparatus 100 in the interface station 5 to the exposure apparatus 4 and subjected to exposure processing. The wafer W is then transferred by the wafer transfer apparatus 100 to the delivery unit 60 in the fourth block G4. The wafer W is then transferred by the wafer transfer apparatus 70 to the thermal treatment unit 40 and subjected to a post-exposure baking treatment. The wafer W is then transferred by the wafer transfer apparatus 70 to the developing treatment unit 30 and developed. After the development is finished, the wafer W is transferred by the wafer transfer apparatus 90 to the thermal treatment unit 40 and subjected to a post-baking treatment, with which a series of photolithography process is completed. Then, the wafer treatment is continuously performed also on the other wafers W in the same lot.

According to the above embodiment, the correlation data between the pixel value and the film thickness is generated in advance at Steps S1 to S3, thereby making it possible to calculate the film thickness of the film formed on the wafer W on the basis of the pixel value of the image of the wafer being the film thickness measurement object imaged in the imaging unit 63 and the correlation data. This makes it possible to find the film thickness from the image acquired using the imaging device 130 such as a CCD camera. Accordingly, the film thickness on the entire surface of the substrate can be found in a short time, for example, without using the reflectance spectroscopic thicknessmeter as in the prior art. Further, the film thickness measurement can be performed in real time online by the imaging unit 63 and the film thickness calculation mechanism 150 without measurement by the film thickness measurement means provided outside the substrate treatment system 1 as in a prior art, so that the treatment on the wafer W in which film thickness failure has occurred can be immediately suspended. This also improves the yield of the wafer treatment.

Note that the case where the imaged image by the imaging unit 63 has three primary colors of RGB has been described in the above embodiment, the colors of the image are not limited only to an RGB system. As long as the correlation between the film thickness and the pixel value can be obtained, for example, an HSV system (Hue, Saturation, Value) or an XYZ color system may be used or a gray scale may be used.

The example in the case where the film thickness of the resist film formed on the wafer W is measured has been described in the above embodiment, but the film being a measurement object is not limited to that in this embodiment. For example, the film is not limited to the coating film such as a resist film but may be an oxide film formed on the wafer W or the like. Further, the film thickness of the resist film on the wafer W which has no pattern is measured in this embodiment, but the present invention is also applicable, for example, to a film formed on the wafer W which already has a predetermined pattern thereon. In this case, for example, it is only necessary to use the preparation wafer T on which a predetermined pattern has been previously formed, at the time when generating the correlation data at Steps S1 to S3.

Though the correlation data generation part 164 generates the correlation data table 511 and obtains the correlation functions illustrated in FIG. 14 on the basis of the correlation data table 511 in the above embodiment, the correlation data generation part 164 may directly calculate the correlation functions illustrated in FIG. 14, for example, on the basis of the pixel value extraction table 510 generated by the pixel value extraction part 163 and the previously obtained measured value table 400.

Next, an embodiment in the case where the film thickness measurement is performed using the imaged image correction part 162 will be described. The imaged image correction part 162 calculates the imaging error in the imaging device 130 and corrects the image stored in the image storage part 161. Examples of the imaging error include optical errors depending on an optical system such as variation in illuminance of the illumination device 132 of the imaging unit 63 and distortion of the lens of the imaging device 130 and the half mirror 131, scan error depending on a scan axis caused by imaging the wafer W being an imaging object passed under the half mirror 131 and so on. These imaging errors occur not depending on the kind, film thickness and so on of the film but as inherent errors in each imaging unit 63. Therefore, the above-described correlation functions generated at Steps S1 to S3 include the imaging error in the imaging unit 63.

On the other hand, between the film thickness and the pixel value, there is originally an inherent correlation not depending on the imaging unit 63 but depending on the kind of the film. Accordingly, by removing the imaging error inherent in the imaging unit 63 from the correlation functions generated at S1 to S3, the correlations after the removal can be used in common among a plurality of imaging units 63.

Hereinafter, correction of the imaging error in the imaged image correction part 162 will be described.

Figure 19:
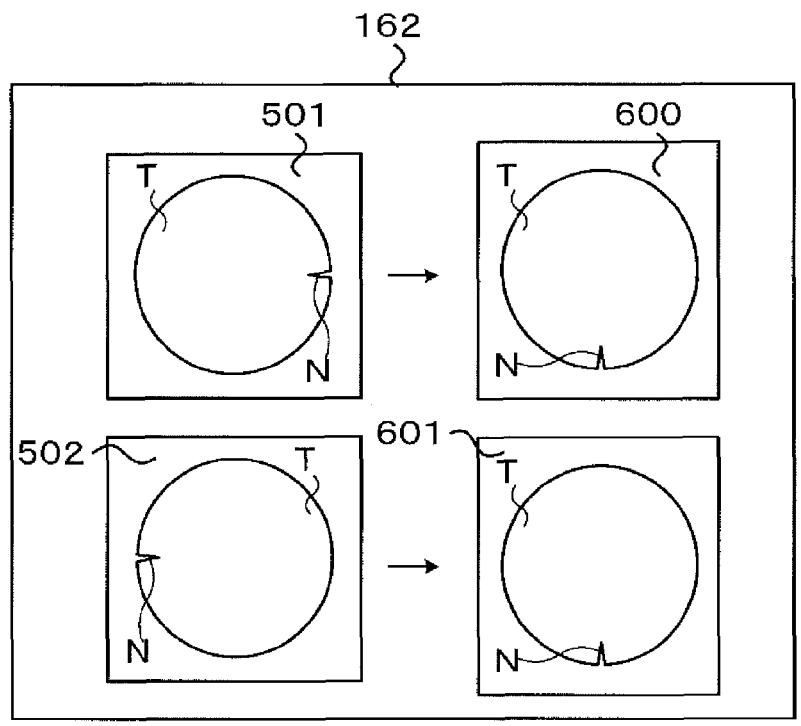
FIG. 19 is an explanatory view schematically illustrating a method of generating a rotated preparation image.

In the imaged image correction part 162, for example, the another preparation imaged image 501 stored in the image storage part 161 is rotated, for example, by 90 degrees clockwise to generate a rotated preparation image 600 with the angle of the notch N set to 0 degrees as illustrated in FIG. 19. Further, the another preparation imaged image 502 is rotated, for example, by 90 degrees counterclockwise to generate a rotated preparation image 601 with the angle of the notch N set to 0 degrees.

Figure 20:
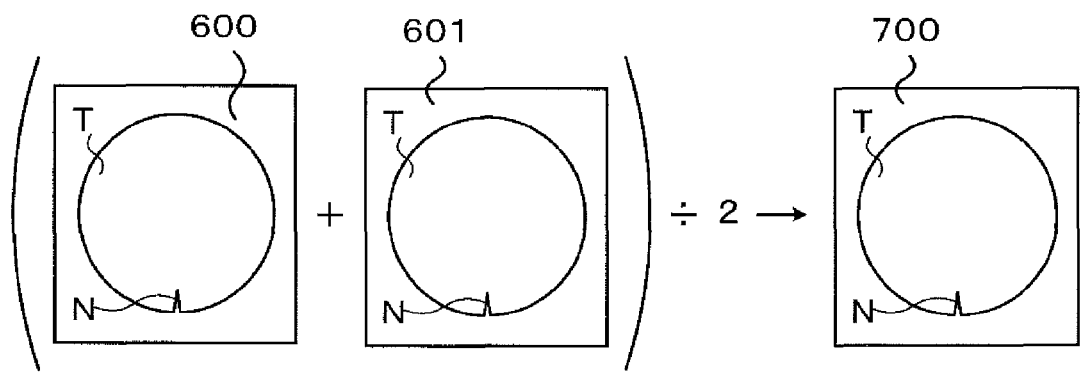
FIG. 20 is an explanatory view schematically illustrating a method of generating an average image.

Subsequently, adding pixel values of the same pixel in the rotated preparation image 600 and the rotated preparation image 601 and dividing the resultant by 2 to thereby generate an average image 700 of the rotated preparation image 600 and the rotated preparation image 601 (FIG. 20).

Figure 21:
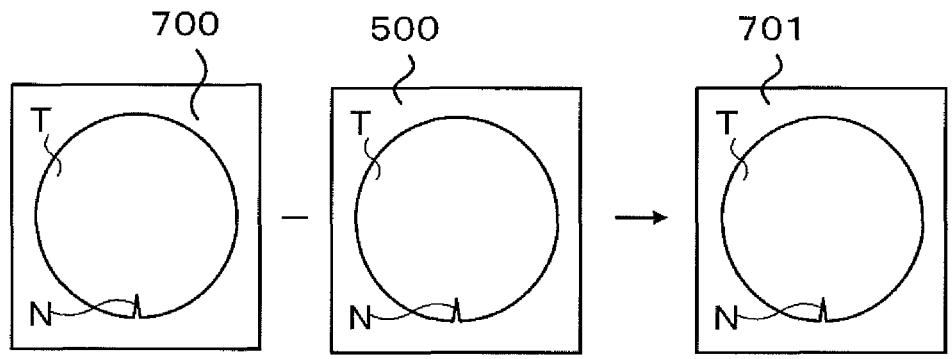
FIG. 21 is an explanatory view schematically illustrating a method of generating a difference image.

Then, the preparation imaged image 500 imaged with the angle of the notch N set to 0 degrees is subtracted from the average image 700 to generate a difference image 701 (FIG. 21). Here, if there is no imaging error in the imaging unit 63, the difference between the average image 700 and the preparation imaged image 500 will be 0 (zero). However, the above-described imaging error exists, which shows that finite pixel values exist in the difference image 701 being the difference between the average image 700 and the preparation imaged image 500. The difference image 701 is an optical error component depending on the optical system of the imaging unit 63.

Figure 22:
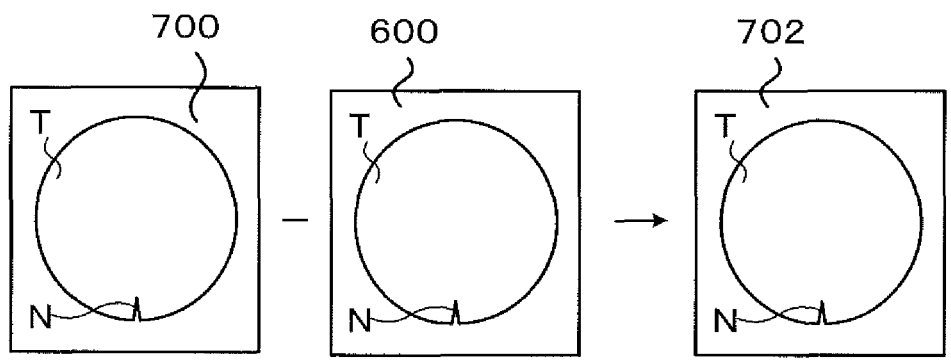
FIG. 22 is an explanatory view schematically illustrating a method of generating another difference image.

Next, the imaged image correction part 162 subtracts, for example, the rotated preparation image 600 from the average image 700 to generate another difference image 702 (FIG. 22). The another difference image 702 represents a scan error component in the imaging unit 63. If there is no scan error in the imaging unit 63, the pixel value in the another difference image 702 will be zero in the entire surface, but finite pixel values basically exist. Note that the image which is subtracted from the average image 700 may be the rotated preparation image 601.

Figure 23:
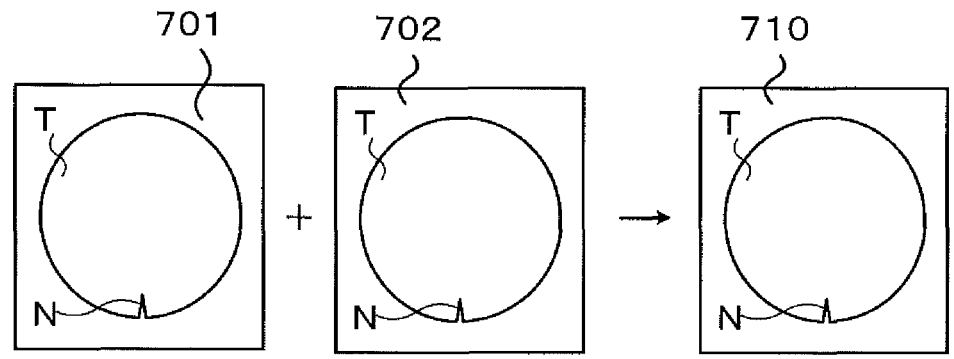
FIG. 23 is an explanatory view schematically illustrating a method of generating an imaging error image.
Figure 24:
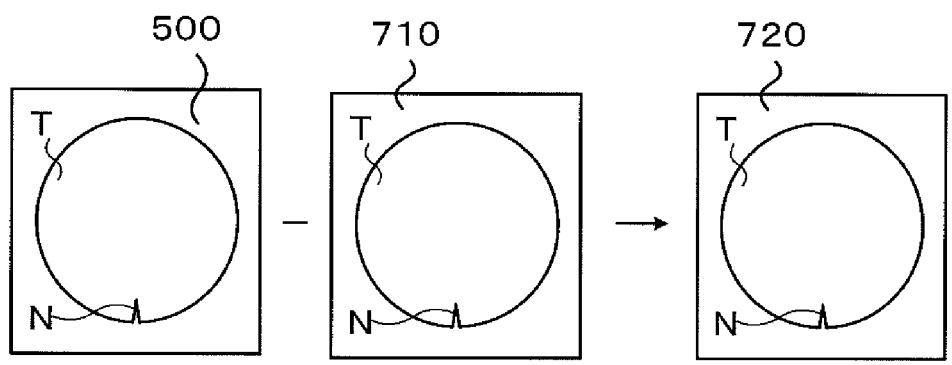
FIG. 24 an explanatory view schematically illustrating a method of generating a corrected imaged image.

By adding the difference image 701 and the another difference image 702, an imaging error image 710 reflecting the imaging error in the imaging unit 63 is generated (FIG. 23). Subsequently, the imaged image correction part 162 subtracts the imaging error image 710 from the preparation imaged image 500 stored in the image storage part 161 to generate a corrected imaged image 720 (FIG. 24). Then, the imaged image correction part 162 stores the corrected imaged image 720 so that the correlation data generation part 164 uses the corrected imaged image 720 instead of the preparation imaged image 500 at the time when generating the correlation data. This removes the imaging error by the imaging unit 63 from the correlation data generated in the correlation data generation part 164, resulting in correlation data unique to the film. Then, use of this correlation data makes it possible for the film thickness calculation part 165 to calculate a film thickness measured value from which the imaging error has been removed and is thus more accurate.

Note that generally in the case where the imaging unit 63 or the like is used to inspect the wafer W including film thickness measurement in the coating and developing treatment system, a technique is sometimes used in which a reference image being an image of the wafer W in an ideal state without defects nor film thickness failure is generated in advance, and comparison with the reference image is made to detect defects and film thickness failure. Accordingly, also in the substrate treatment system 1 according to this embodiment, the film thickness of a film formed on the wafer W may be calculated using the reference image. Hereinafter, an example of the case of calculating the film thickness using the reference image will be described.

For generation of the reference image, for example, the imaged image correction part 162 extracts a pixel value corresponding to the target value of the film thickness of the coating film to be applied in the substrate treatment system 1 from the preparation imaged image 500. In this embodiment, for example, the film thickness of the resist film is coincide with 250 nm being the target value at a point where the "measurement point number" in the correlation data table 511 illustrated in FIG. 13 is "3", and therefore the pixel values of R, G, B at the "measurement point number 3" are extracted as "125", "68", "204" respectively. Then, a replaced image made by replacing pixel values at a plurality of coordinates on the entire imaged image of the wafer W with the extracted pixel value is generated (a replaced image generation step). This replaced image is an image when a resist film with a thickness of 250 nm is formed uniformly within a plane of the entire surface of the wafer W, but since the imaging unit 63 has a predetermined imaging error as described above, the imaging error image 710 generated by the imaged image correction part 162 is subtracted from the replaced image to obtain a difference between the images (a reference image generation step). Then, an image obtained by the subtraction between the replaced image and the imaging error image 710 is the reference image obtained when the imaging unit 63 images the wafer W in the ideal state in which the resist film with a film thickness of 250 nm is formed uniformly within a plane.

Then, the pixel value extraction part 163 obtains a difference image between the reference image and the preparation imaged image 500 or the another preparation imaged image 501, 502, and generates the pixel value extraction table 510 on the basis of the difference image. Then, at Step S3, the correlation data generation part 164 generates the correlation data between the film thickness measured value and the pixel value on the basis of the pixel value extraction table 510 generated using the reference image.

Then, the film thickness calculation part 165 obtains an image made by subtraction between the imaged image of the wafer W after the resist film is applied in the coating unit 32 imaged in the imaging unit 63 and the reference image, and calculates the film thickness of the resist film formed on the wafer W while handling the image obtained by the subtraction as the imaged image of the wafer W being a film thickness measurement object and using the image and the correlation data generated by the correlation data generation part 164. Thus, even in the case of using the reference image, the film thickness on the wafer W can be obtained in a short time on the basis of the imaged image in the imaging unit 63. Further, using the reference image enables an accurate determination with the imaging error and the noise in the image removed therefrom at the time when determining the presence or absence of defects such as splatter and wedging, for example, on the basis of the image generated at Step S5.

Note that though the average image 700 is generated base on the another preparation imaged image 501 and the another preparation imaged image 502 in the above embodiment, the average image 700 may be generated, for example, by averaging the preparation imaged image 500 and the another preparation imaged image 501 or the another preparation imaged image 502. The combination of the preparation imaged image 500 and the another preparation imaged image 501, 502 for generation of the average image may be arbitrarily set.

The case where the film thickness measurement means is provided outside the substrate treatment system 1 has been described in the above embodiment, and a case where the film thickness measurement means is provided inside the substrate treatment system 1 will be described next. The film thickness measurement means can be arranged at an arbitrary position inside the substrate treatment system 1, and is arranged stacked, for example, on the imaging unit 63 in the fourth block G4. Further, as the film thickness measurement means, for example, a thicknessmeter utilizing, for example, reflectance spectroscopy or the like can be used.

FIG. 25 is a flowchart illustrating main steps of the film thickness measurement of the resist film formed on the wafer W in this embodiment. In the substrate treatment system 1, first, a measurement preparation wafer T is transferred in and subjected to photolithography processing. In the photolithography processing, the preparation wafer T is subjected to formation of a resist film in the resist coating unit 32 and further to a pre-baking treatment in the thermal treatment unit 40, and then transferred to the film thickness measurement means.

In the film thickness measurement means, the angle of the notch N of the preparation wafer T is adjusted to 90 degrees (Step S11 in FIG. 25), and then the film thickness of the resist film on the preparation wafer T is measured (Step S12 in FIG. 25). In the measurement of the film thickness, the film thicknesses at a plurality of points are measured along the direction of the diameter of the preparation wafer T, for example, as illustrated in FIG. 8. Note that FIG. 8 illustrates the state where the angle of the notch N is 0 degrees, but the film thickness is measured in the state where the angle of the notch N is set to 90 degrees in this embodiment.

The film thickness of the resist film on the preparation wafer T measured by the film thickness measurement means is acquired as the measured value table 400 together with coordinates corresponding to the film thickness measured value for each measurement point, and the acquired measured value table 400 is stored in the measured value storage part 160. Note that this step is the same as Step S1 in FIG. 10.

The preparation wafer T is then transferred to the imaging unit 63. In the imaging unit 63, the front surface of the preparation wafer T is imaged with the angle of the notch N of the preparation wafer T set to 90 degrees (Step S12 in FIG. 25). Specifically, as illustrated in FIG. 11, the another preparation imaged image 501 with the angle of the notch N set to 90 degrees is imaged, and the another preparation imaged image 501 is stored in the image storage part 161.

The preparation wafer T is then rotated by 180 degrees in the imaging unit 63, whereby the angle of the notch N is set to 270 degrees (Step S13 in FIG. 25). Subsequently, with the angle of the notch N of the preparation wafer T set to 270 degrees, the front surface of the preparation wafer T is imaged (Step S14 in FIG. 25). Specifically, as illustrated in FIG. 11, the another preparation imaged image 502 with the angle of the notch N set to 270 degrees is imaged, and the another preparation imaged image 502 is stored in the image storage part 161.

The preparation wafer T is then rotated by 90 degrees in the imaging unit 63, whereby the angle of the notch N is set to 0 degrees (Step S15 in FIG. 25). Subsequently, with the angle of the notch N of the preparation wafer T set to 0 degrees, the front surface of the preparation wafer T is imaged (Step S16 in FIG. 25). Specifically, as illustrated in FIG. 11, the preparation imaged image 500 with the angle of the notch N set to 0 degrees is imaged, and the preparation imaged image 500 is stored in the image storage part 161.

Here, the imaged image correction part 162 calculates an imaging error (optical error and scan error) in the imaging device 130 and generates the imaging error image 710 illustrated in FIG. 23. More specifically, as in the above embodiment, based on the another preparation imaged image 501 imaged at Step S12, the another preparation imaged image 502 imaged at Step S14, and the preparation imaged image 500 imaged at Step S16, the rotated preparation images 600, 601 illustrated in FIG. 19, the average image 700 illustrated in FIG. 20, the difference image 701 illustrated in FIG. 21, and the another difference image 702 illustrated in FIG. 22 are generated to generate the imaging error image 710 illustrated in FIG. 23.

Next, the reference image is generated. For generation of the reference image, for example, the imaged image correction part 162 extracts a pixel value corresponding to the target value of the film thickness of the resist film to be applied in the substrate treatment system 1, for example, 250 nm, from the preparation imaged image 500. Then, the imaged image correction part 162 generates a replaced image made by replacing pixel values at a plurality of coordinates on the entire preparation imaged image 500 with the extracted pixel value. This replaced image is an image when the resist film with a thickness of 250 nm is formed within a plane of the entire surface of the wafer W, but since the imaging unit 63 has a predetermined imaging error as described above, the imaging error image 710 generated by the imaged image correction part 162 is subtracted from the replaced image to obtain a difference between the images. Then, an image obtained by the subtraction between the replaced image and the imaging error image 710 is the reference image obtained when the imaging unit 63 images the wafer W in the ideal state in which the resist film with a film thickness of 250 nm is formed uniformly within a plane.

Then, the pixel value extraction part 163 obtains a difference image between the reference image and the preparation imaged image 500 or the another preparation imaged image 501, 502 and generates the pixel value extraction table 510 on the basis of the difference image. Note that this step is the same as Step S2 in FIG. 10.

Then, the correlation data generation part 164 generates the correlation data between the pixel value and the film thickness measured value on the basis of the pixel value extraction table 510 generated using the reference image. This step is the same as Step S3 in FIG. 10.

Next, in the substrate treatment system 1, a subsequent wafer W is transferred in and subjected to photolithography processing. In the photolithography processing, the wafer W subjected to formation of a resist film in the resist coating unit 32 and further to a pre-baking treatment in the thermal treatment unit 40 is transferred to the imaging unit 63.

In the imaging unit 63, the angle of the notch N of the wafer W is adjusted to 0 degrees (Step S17 in FIG. 25), and then the front surface of the wafer W is imaged (Step S18 in FIG. 25). Data on the imaged image imaged in the imaging unit 63 is inputted into the film thickness calculation mechanism 150 via the control device 6.

Then, the film thickness calculation part 165 obtains an image made by subtraction between the imaged image of the wafer W imaged in the imaging unit 63 and the reference image, and calculates the film thickness of the resist film formed on the wafer W while handling the image obtained by the subtraction as the imaged image of the wafer W being a film thickness measurement object and using the image and the correlation data generated by the correlation data generation part 164. Note that this step is the same as Steps S4 and S5 in FIG. 10.

As a result of the calculation of the film thickness by the film thickness calculation mechanism 150, for example, when the film thickness distribution is in a desired state, the wafer W is subjected to subsequent treatments. When the film thickness distribution is not in the desired state, or when it is confirmed that defects such as splatter and wedging have occurred, the treatment on the wafer W is stopped and the wafer W is recovered into the cassette C.

Thus, a series of photolithography process is completed. Then, the wafer treatment is continuously performed also on the other wafers W in the same lot.

Even when the film thickness measurement means is provided inside the substrate treatment system 1 as in this embodiment, the same effects as those in the case where the film thickness measurement means is provided outside the substrate treatment system 1 can be offered. In short, the film thickness measurement of the resist film formed on the wafer W can be performed in a short time over the entire surface of the wafer W.

Note that the front surface of the preparation wafer T is imaged in the imaging unit 63 with the angle of the notch N set to 270 degrees at Step S14, and the film thickness of the resist film on the preparation wafer T may be measured by the film thickness measurement means. The film thickness measurement may be performed divided at Step S12 and Step S14 according to the film thickness measurement time in the film thickness measurement means so that the throughput of the whole wafer treatment is optimized.

Further, when the target value of the film thickness of the resist film on the wafer W is different, only the film thickness measurement result in the film thickness measurement means may be changed in the film thickness calculation mechanism 150. Further, for example, in an automatic setup or the like, a processing recipe in the imaging unit 63 may be fixed.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention. Though the imaging object is the front of the substrate in the above embodiments, the present invention is also applicable to the case where a film formed on a rear surface of the substrate is imaged. Further, though the above-described embodiments are the examples in the coating and developing treatment system for the semiconductor wafer, the present invention is also applicable to the case of a coating and developing treatment system for another substrate such as an FPD (Flat Panel Display), a mask reticle for a photomask or the like other than the semiconductor wafer.

What is claimed is:

1. A film thickness measurement apparatus configured to measure a film thickness of a film formed on a substrate, the film thickness measurement apparatus comprising:
    an imaging device that images a front surface of the substrate;
    a measured value storage part that stores a plurality of film thickness measured values obtained by measurement in advance at a plurality of coordinates on a measurement preparation substrate and coordinates corresponding to the film thickness measured values, for a film formed on the measurement preparation substrate and having a non-uniform thickness;
    an image storage part that stores a preparation imaged image obtained by imaging the measurement preparation substrate in advance by the imaging device;
    a pixel value extraction part that extracts a pixel value at each coordinates stored in the measured value storage part from the preparation imaged image stored in the image storage part;
    a correlation data generation part that extracts, from the measured value storage part, the film thickness measured value at each coordinates corresponding to the extracted pixel value, and generates correlation data between the extracted film thickness measured value and the extracted pixel value; and
    a film thickness calculation part that calculates a film thickness of a film formed on a substrate being a film thickness measurement object on a basis of a pixel value of an imaged image of the substrate being the film thickness measurement object and the correlation data generated in the correlation data generation part.

2. The film thickness measurement apparatus according to claim 1, further comprising:
    an image correction part that calculates an imaging error in the imaging device, generates a corrected imaged image obtained by correcting the imaging error of the preparation imaged image stored in the image storage part, and stores the corrected imaged image,
    wherein the pixel value extraction part extracts a pixel value from the corrected imaged image stored in the image correction part.

3. The film thickness measurement apparatus according to claim 2,
    wherein calculation of the imaging error in the image correction part is performed by:
    acquiring another preparation imaged image obtained by imaging the measurement preparation substrate in a state that the measurement preparation substrate is rotated in a circumferential direction by a predetermined angle from a state that the preparation imaged image stored in the image storage part is imaged;
    generating an average image obtained by combining the another preparation imaged image in a state of being reversely rotated in the circumferential direction by the predetermined angle with the imaged image and then averaging a resultant thereof; and
    obtaining a difference between the average image and the preparation imaged image or the another preparation imaged image.

4. The film thickness measurement apparatus according to claim 3,
    wherein the image correction part is configured to:
    extract a pixel value corresponding to a desired film thickness from the preparation imaged image or the another preparation imaged image, and generate a replaced image made by replacing pixel values at the plurality of coordinates on an entire surface of the measurement preparation substrate with the extracted pixel value; and correct the replaced image by an imaging error difference calculated by the image correction part to generate a reference image, and wherein the pixel value extraction part extracts a pixel value from a difference image between the reference image and the preparation imaged image or the another preparation imaged image.

5. The film thickness measurement apparatus according to claim 1, wherein when the preparation imaged image and the imaged image of the substrate being the film thickness measurement object are composed of a plurality of primary colors, the correlation data generation part generates the correlation data for each of the primary colors and specifies a primary color having a largest correlation coefficient between the film thickness measured value and the extracted pixel value among the correlation data generated by the correlation data generation part, and wherein the film thickness calculation part calculates the film thickness on a basis of the correlation data on the specified primary color.

6. A film thickness measurement method of measuring a film thickness of a film formed on a substrate, the film thickness measurement method comprising:

a film thickness coordinate acquisition step of acquiring film thickness measured values obtained by measurement in advance at a plurality of points on a measurement preparation substrate and coordinates corresponding to the film thickness measured values, for a film formed on the measurement preparation substrate and having a non-uniform thickness;

a pixel value extraction step of extracting a pixel value at each coordinates acquired at the film thickness coordinate acquisition step from a preparation imaged image obtained by imaging the measurement preparation substrate in advance by an imaging device;

a correlation data generation step of generating correlation data between the pixel value extracted at each coordinates and the film thickness measured value at each coordinates; and a film thickness calculation step of imaging a substrate being a film thickness measurement object by the imaging device to acquire an imaged image, and calculating a film thickness of a film formed on the substrate being the film thickness measurement object on a basis of a pixel value of the imaged image and the correlation data.

7. The film thickness measurement method according to claim 6, further comprising:

an image correction step of calculating an imaging error in the imaging device, and generating a corrected imaged image obtained by correcting the imaging error of the preparation imaged image, wherein the pixel value extraction step extracts a pixel value from the corrected imaged image generated at the image correction step.

8. The film thickness measurement method according to claim 7, wherein calculation of the imaging error at the image correction step is performed by:

acquiring another preparation imaged image obtained by imaging the measurement preparation substrate in a state that the measurement preparation substrate is rotated in a circumferential direction by a predetermined angle from a state that the preparation imaged image is imaged;

generating an average image obtained by combining the another preparation imaged image in a state of being reversely rotated in the circumferential direction by the predetermined angle with the imaged image and then averaging a resultant thereof; and obtaining a difference between the average image and the preparation imaged image or the another preparation imaged image.

9. The film thickness measurement method according to claim 8, wherein the image correction step further comprises:

a replaced image generation step of extracting a pixel value corresponding to a desired film thickness from the preparation imaged image or the another preparation imaged image, and generating a replaced image made by replacing pixel values at the plurality of coordinates on an entire surface of the measurement preparation substrate with the extracted pixel value; and a reference image generation step of correcting the replaced image by the calculated imaging error difference to generate a reference image, and wherein the pixel value extraction step extracts a pixel value from a difference image between the reference image and the preparation imaged image or the another preparation imaged image.

10. The film thickness measurement method according to claim 6, wherein when the preparation imaged image and the imaged image of the substrate being the film thickness measurement object are composed of a plurality of primary colors, the correlation data generation step generates the correlation data for each of the primary colors and specifies a primary color having a largest correlation coefficient between the film thickness measured value and the extracted pixel value among the correlation data generated at the correlation data generation step, and wherein the film thickness calculation step calculates the film thickness on a basis of the correlation data for the specified primary color.

11. A non-transitory computer-readable storage medium storing a program running on a computer of a control device configured to control a film thickness measurement apparatus for the film thickness measurement apparatus to perform a film thickness measurement method of measuring a film thickness of a film formed on a substrate, the film thickness measurement method comprising:

a film thickness coordinate acquisition step of acquiring film thickness measured values obtained by measurement in advance at a plurality of points on a measurement preparation substrate and coordinates corresponding to the film thickness measured values, for a film formed on the measurement preparation substrate and having a non-uniform thickness;

a pixel value extraction step of extracting a pixel value at each coordinates acquired at the film thickness coordinate acquisition step from a preparation imaged image obtained by imaging the measurement preparation substrate in advance by an imaging device;

a correlation data generation step of generating correlation data between the pixel value extracted at each coordinates and the film thickness measured value at each coordinates; and a film thickness calculation step of imaging a substrate being a film thickness measurement object by the imaging device to acquire an imaged image, and calculating a film thickness of a film formed on the substrate being the film thickness measurement object on a basis of a pixel value of the imaged image and the correlation data.

* * * * *